US00RE38109E

(19) United States
(12) Reissued Patent
Merritt et al.

(10) Patent Number: US RE38,109 E
(45) Date of Reissued Patent: May 6, 2003

(54) BLOCK WRITE CIRCUIT AND METHOD FOR WIDE DATA PATH MEMORY DEVICE

(75) Inventors: Todd A. Merritt, Boise, ID (US); Layne Bunker, Boise, ID (US)

(73) Assignee: Micron Technology, Inc., Boise, ID (US)

(21) Appl. No.: 10/029,572

(22) Filed: Dec. 20, 2001

Related U.S. Patent Documents

Reissue of:
(64) Patent No.: 6,011,727
Issued: Jan. 4, 2000
Appl. No.: 09/140,354
Filed: Aug. 26, 1998

(51) Int. Cl.[7] ..... G11C 7/00
(52) U.S. Cl. ..... 365/189.02; 365/189.04; 365/238.5
(58) Field of Search ..... 365/189.02, 189.04, 365/230.02, 230.03, 238.5

(56) References Cited

U.S. PATENT DOCUMENTS

| | | | | | |
|---|---|---|---|---|---|
| 5,229,971 | A | | 7/1993 | Kiryu et al. | 365/230.03 |
| 5,539,430 | A | | 7/1996 | Priem et al. | 345/545 |
| 5,657,287 | A | | 8/1997 | McLaury et al. | 365/230.01 |
| 5,764,963 | A | | 6/1998 | Ware et al. | 345/563 |
| 5,825,712 | A | | 10/1998 | Higashi et al. | 365/230.03 |
| 5,900,887 | A | | 5/1999 | Leung et al. | 345/531 |
| 6,115,280 | A | * | 9/2000 | Wada | 365/189.02 |
| 6,122,219 | A | * | 9/2000 | Zheng et al. | 365/189.02 |

FOREIGN PATENT DOCUMENTS

| | | |
|---|---|---|
| DE | 4025151 A1 | 5/1991 |
| WO | WO 00/13184 | 3/2000 |

OTHER PUBLICATIONS

T. Yabe et al., "A Configurable DRAM Macro Design for 2112 Derivative Organizations to be Synthesized Using a Memory Generator", in *IEEE International Solid–State Circuits Conference*, 56–57 and 72–73, 1998.

R. Torrance et al., "A 33 GB/s 13.4Mb Integrated Graphics Accelerator and Frame Buffer", in *IEEE Internaitonal Solid–State Circuits Conference*, 274–275 and 340–341, 1998.

Jeffrey Dreibelbis et al., "An ASIC–Library Granular DRAM Macro with Built–In Self Test", in *IEEE International Solid–State Circuits Conference*, 58–59 and 74–75, 1998.

Yamazaki, A. et al., "Large Scale Embedded DRAM Technology", IEICE Transactions on Electronics, JP, Institute of Electronics Information and Comm., Eng., Tokyo, vol. E81–C, No. 5, p. 750–757, 1998.

* cited by examiner

*Primary Examiner*—Son Mai
(74) *Attorney, Agent, or Firm*—Dorsey & Whitney LLP

(57) ABSTRACT

A block write circuit in a memory device having a wide internal data path performs block write and data masking functions. The memory device includes a plurality of data terminals adapted to receive respective data signals, and a plurality of array groups each including a plurality of arrays and each array includes a plurality of memory cells. A plurality of input/output line groups each include a plurality of input/output lines coupled to the arrays of an associated array group. The block write circuit comprises a plurality of write driver groups, each write driver group including a plurality of write driver circuits having outputs coupled to respective data lines in an associated data line group. Each write driver circuit includes an input and develops a data signal on its output responsive to a data signal applied on its input. A multiplexer circuit includes a plurality of inputs coupled to respective data terminals, and a plurality of output subgroups. Each output subgroup is associated with a respective input, and each output group includes a plurality of outputs coupled to the write driver circuits in an associated write driver group. The multiplexer circuit operates responsive to a control in a block write mode to couple each of its inputs to the outputs in the associated output subgroup. A masking circuit may also mask data from respective input/output lines responsive to masking signals.

76 Claims, 5 Drawing Sheets

BLOCK WRITE CIRCUIT AND METHOD FOR WIDE DATA PATH MEMORY DEVICE

Matter enclosed in heavy brackets [ ] appears in the original patent but forms no part of this reissue specification; matter printed in italics indicates the additions made by reissue.

TECHNICAL FIELD

The present invention relates generally to semiconductor memories, and more specifically to a method and circuit for performing a block write data transfer in a memory device having a wide internal data path.

BACKGROUND OF THE INVENTION

A computer system typically includes a video system that displays information for a computer user. In a typical video system, a video controller accesses data stored in video memory and drives a display unit, such as a cathode ray tube, to display the stored information, as understood by one skilled in the art. The video memory typically includes specialized dynamic random access memories ("DRAM"), such as a synchronous graphics DRAM ("SGRAM"), which include special functions that enable the video controller to more efficiently access stored video data and drive the display unit. Such special functions typically include bit-masking, byte-masking, and block write functions. In bit-masking, selected bits of write data applied on a data bus of the SGRAM are masked from corresponding addressed memory cells so the data stored in those cells is not overwritten. Byte-masking is analogous to bit-masking except that bytes of write data applied on the data bus are selectively masked from eight corresponding memory cells. The block write function enables the SGRAM to transfer a single bit of data to a group or block of memory cells, which reduces the time it takes to transfer the same data to a large number of memory cells. A typical application of the block write function is writing data corresponding to a desired background color for a video screen to a plurality of memory cells in the SCRAM.

FIG. 1 is a functional block diagram of a portion of a conventional SGRAM 100 including a conventional block write circuit 102 coupled to a memory-cell arrayed 104 including a plurality of memory cells (not shown) arranged in rows and columns. A block 106 of memory cells in the array 104 is shown, and corresponds to a group of eight memory cells in an activated row in the array. A number of digit lines DL0–DL7 are shown coupled to respective memory cells in the block 106. One skilled in the art will realize the depiction of the array 104 has been simplified for ease of explanation, and that components such as sense amplifiers and complementary signal lines have been omitted for the sake of brevity.

The block write circuit 102 includes a column mask decoder 108 receiving a number of column mask bits CM0–CM7 stored in a column mask register 110. The column mask bits CM0–CM7 correspond to data placed on respective data terminals DQ0–DQ7 coincident with a block write command applied to the SGRAM 100, as understood by one skilled in the art. In response to the column mask bits CM0–CM7, the column mask decoder 108 activates a number of column select signals CSEL0–CSEL7. When one of the column mask bits CM0–CM7 is set, the column mask decoder 108 deactivates the corresponding column select signal CSEL0–CSEL7, and when one of the mask bits CM0–CM7 is cleared, the column mask circuit 108 activates the corresponding column select signal CSEL0–CSEL7. A number of input/output transistors 112a–h are coupled between the digit lines DL0–DL7, respectively, and an input/output or input/output line I/O1. Each of the transistors 112a–h receives on its gate a respective one of the column select signals CSEL0–CSEL7. The transistors 112a–h each turn ON when the applied one of the column select signals CSEL0–CSEL7 is active, and thereby couples the input/output line I/O1 to the corresponding digit lines DL0–DL7. When any of the column select signals CSEL0–CSEL7 is inactive, the corresponding transistors 112a–h turn OFF, isolating the corresponding digit lines DL0–DL7 from the input/output line I/O1.

A write driver 114 receives on its input either a color bit CR0 or a write data bit applied on the data terminal DQ0, and applies the data on its input to the input/output line I/O1 in response to a masking signal $\overline{M}$ received on an enable input. An AND gate 116 develops the mask signal $\overline{M}$ in response to a byte-mask signal DQM0 applied on a first input and a mask bit MR0 applied on a second input. When the mask bit MR0 is set low or the byte-mask signal is active high, the AND gate 116 drives the mask signal $\overline{M}$ active low, and when the mask bit MR0 is cleared high and the byte-mask signal DQM0 is inactive low, the AND gate 116 drives the mask signal $\overline{M}$ inactive high. In operation during a standard write operation, conventional address decode circuitry (not shown in FIG. 1) decodes address signals applied to the SGRAM 100 and activates a corresponding memory cell in the array 104, as understood by one skilled in the art. The write driver 114 then transfers data applied on the terminal DQ0 onto the input/output line I/O1 when the mask signal $\overline{M}$ is inactive high, and places its output in a high-impedance state to isolate or "mask" this data from the input/output line I/O1 when the mask signal $\overline{M}$ is active low.

In operation during a block write data transfer, the block write circuit 102 transfers the color bit CR0 to selected ones of the memory cells in the block 106, as will now be described in more detail. During a block write, the address decode circuitry once again decodes address signals applied to the SGRAM 100, and activates corresponding memory cells in the array 104, as understood by one skilled in the art. If either the mask bit MR0 is set or the byte-mask signal DQM0 is active high, the write driver 114 places its output in a high impedance state, masking the color bit CR0 from the memory cells in the block 106 independent of the state of the column select signals CSEL0–CSEL7. In this situation, the data stored in the block 106 is not altered during the block write operation. When the mask bit MR0 is cleared and the byte-mask signal DQM0 is inactive low, the write driver 114 places the color bit CR0 on the input/output line I/O1, and the column mask decoder 108 activates selected ones of the column select signals CSEL0–CSEL7 in response to the column mask bits CM0–CM7. In response to the column select signals CSEL0–CSEL7, selected ones of the transistors 112a–h turn ON, coupling the corresponding digit lines DL0–DL7 to the input/output line I/O1. The color bit CR0 is then transferred through the activated ones of the transistors 112a–h and over the corresponding digit lines DL0–DL7 to respective memory cells in the block 106. If any of the column mask bits CM0–CM7 is set, the corresponding one of the column select signals CSEL0–CSEL7 is deactivated, turning off the associated one of the transistors 112a–h and thereby masking the color bit CR0 from the corresponding memory cell in the block 106. For example, when the column mask bit CR6 is set, the column select signal CSEL6 is deactivated, turning OFF the transistor 112g and thereby masking the color bit CR0 from the memory cell in the block 106 coupled to the digit line DL6. In this way, the column mask decoder 108 masks the color bit CR0 from respective cells within the block 18, which is known as "column masking."

From this description, it is seen that during a block write, several of the transistors 112a–h are typically simultaneously activated, coupling several of the digit lines DL0–DL7 to the input/output line I/O1. In fact, when none of the column mask bits CM0–CM7 is set, all of the transistors 112a–h are turned ON, coupling all of the digit lines DL0–DL7 to the input/output line I/O1. As more digit lines DL0–DL7 are coupled to the input/output line I/O1, the load presented by the input/output line I/O1 increases, and this increased load must be driven by the write driver 114. The load presented by the input/output line I/O1 increases because each of the digit lines DL0–DL7 coupled to the input/output line I/O1 presents an additional parallel load the write driver 114 must drive. The additional load presented by each of the digit lines DL0–DL7 includes the load presented by a sense amplifier (not shown in FIG. 1) coupled to the digit line, along with the additional capacitance presented by the digit line, as understood by one skilled in the art. As a result of the additional load presented by the input/output line I/O1, it takes longer for the write driver 114 to drive the voltage on the input/output line I/O1 to the desired level, and thereby increases the time it takes the conventional block write circuit 102 to perform each block write data transfer. One skilled in the art will appreciate that during standard write data transfers, a single digit line DL is coupled to the input/output line I/O1, reducing the load driven by the write driver 114 relative to block write transfers, and thereby reducing the time required to perform such standard write transfers.

Although the conventional block write circuit 102 typically increases the time required for performing block write operations, the circuit performs satisfactorily in most conventional SGRAMs. As the speed of microprocessors and bandwidths of memory devices steadily increase, however, the time for performing block write operations becomes more critical. In addition, the column masking performed by the conventional block write circuit 102 may be difficult to implement in many new memory devices, such as packetized DRAMs and Embedded DRAMs, having very wide internal data paths. The internal data path includes the input/output lines I/O, and a wide internal data path accordingly includes more such lines. With a wide internal data path, the number of input/output lines I/O associated with each array increases and the number of column select signals CSEL associated with each array typically decreases. The number of column select lines decreases because for each column select signal CSEL more data is transferred out of the array on the input/output lines I/O. For example, in an array where each row includes 128 columns and 64 input/output lines (i.e., a 64-bit internal data bus) are associated with the array, only two column select lines CSEL are required, one to transfer the data stored in the memory cells in the first 64 columns onto the respective input/output lines, and a second column select signal to do the same for the data stored in the second 64 columns. As the number of column select signals CSEL decreases, the approach illustrated in FIG. 2 for performing column masking during block write operations may be difficult to implement since the column mask decoder 108 no longer applies separate column select signals CSEL to each column select transistor. For example, in the array described above having 128 columns of memory cells and 64 associated input/output lines, the column select transistors associated with the first 64 columns have their gates coupled together to receive the first column select signal. In this situation, individual column select transistors cannot be separately activated since their respective gates are coupled together.

There is a need for a block write circuit in a memory device having a wide internal data path that decreases the time required for performing block write operations and performs column masking of bits within each block.

SUMMARY OF THE INVENTION

A block write circuit in a memory device performs block write operations in a memory device having a wide internal data path. The memory device includes at least one array having a plurality of memory cells arranged in rows and columns. The array includes a plurality of digit lines, each digit line coupled to a plurality of memory cells in an associated column. According to one aspect of the present invention, the block write circuit includes a plurality of input/output lines and a switch circuit coupled between the input/output lines and the digit lines. The switch circuit selectively couples at least one digit line to each input/output line responsive to an address signal during a block write mode of operation. A plurality of driver circuits each includes an input, and an output coupled to a respective input/output line, and develops a data signal on its output in response to a data signal applied on its input. A multiplexer circuit has an input adapted to receive a data signal and a plurality of outputs coupled to respective inputs of the driver circuits. The multiplexer circuit couples its input to its outputs responsive to a control signal during the block write mode of operation.

According to another aspect of the present invention, the multiplexer circuit isolates its input from selected ones of outputs responsive to column masking signals. In this way, the multiplexer masks data applied on its input from corresponding input/output lines, and thereby masks the data from corresponding memory cells in the array.

DETAILED DESCRIPTION OF THE INVENTION

Figure 2A:
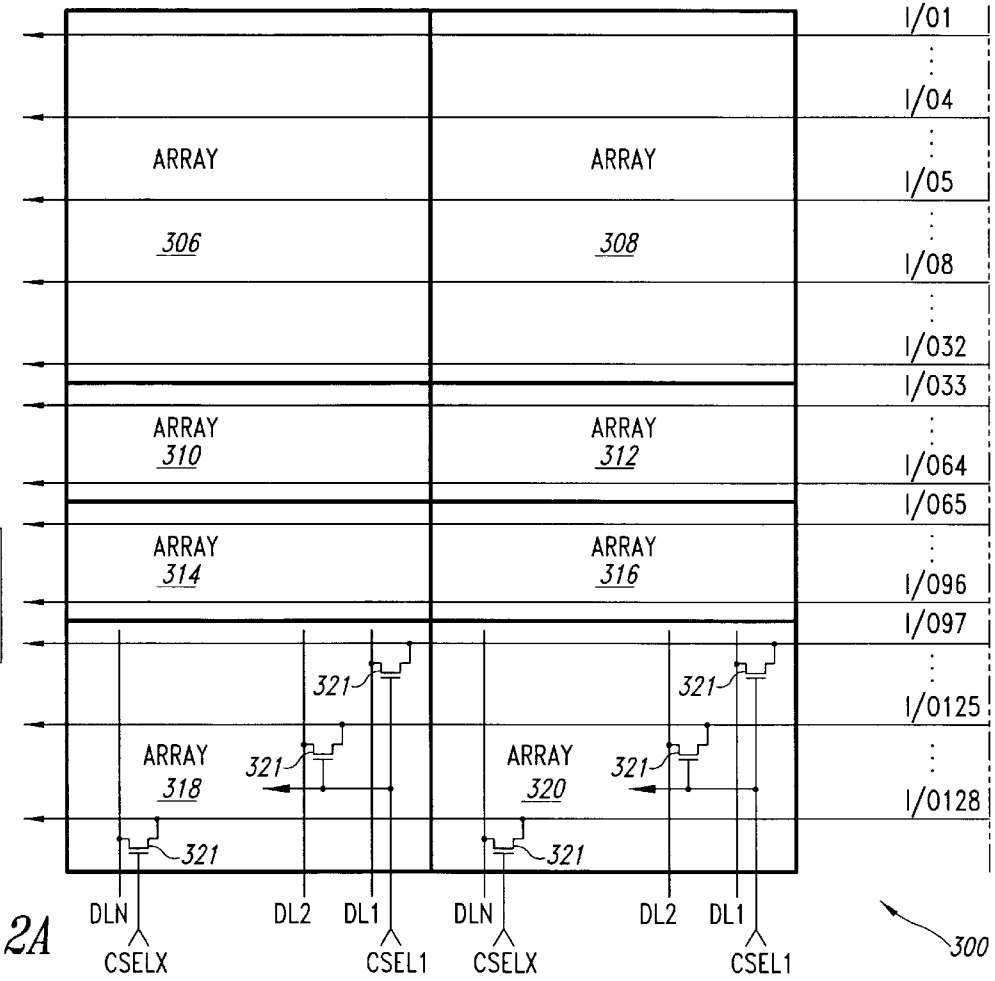
FIG. 2 consisting of FIGS. 2A and 2B is a functional block diagram of a portion of a memory device having a wide data path coupled to a block write circuit according to one embodiment of the present invention.
Figure 2:
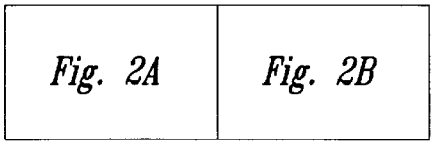
Figure 2B:
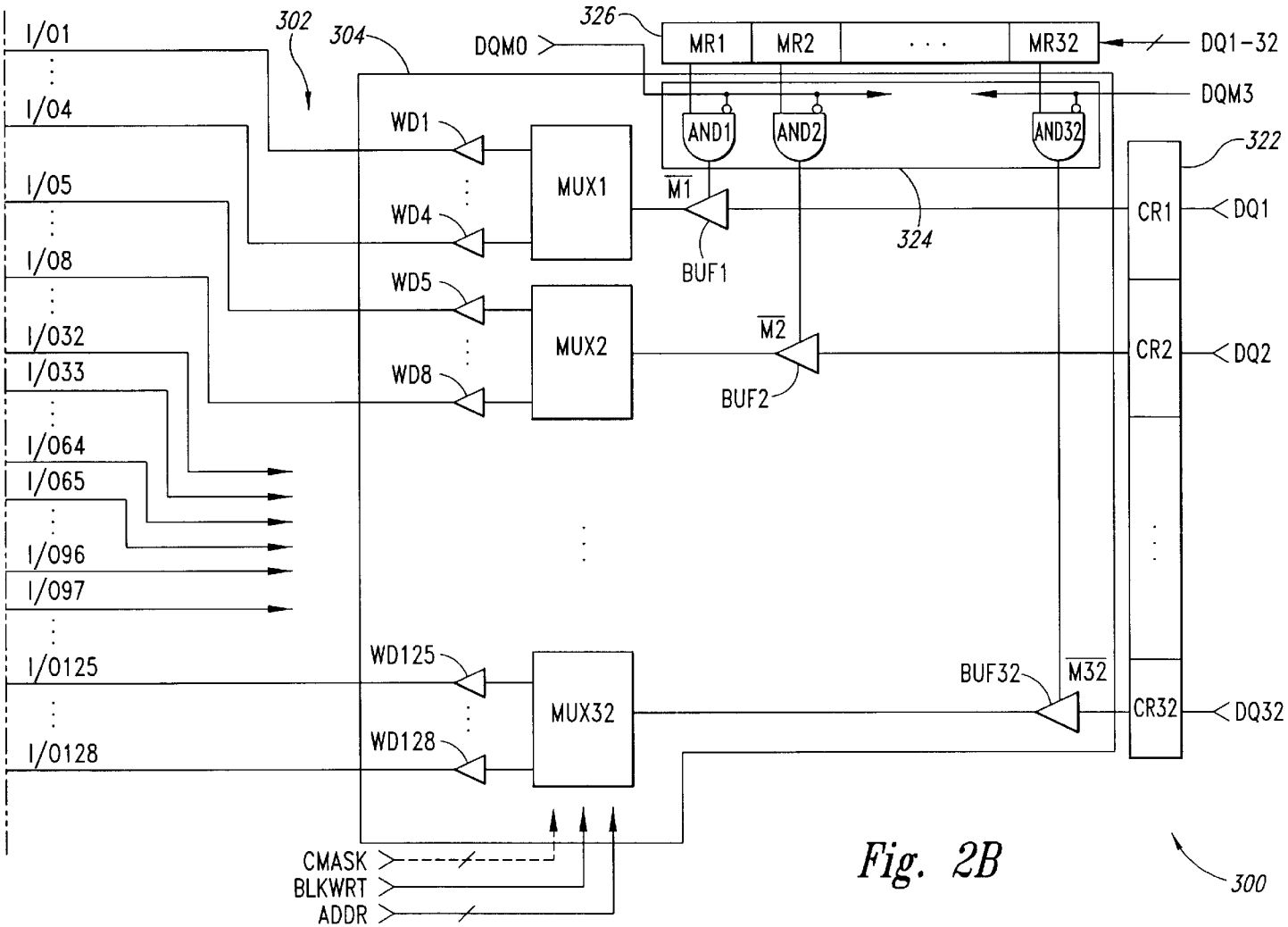

FIG. 2 is a functional block diagram of a portion of a memory device 300 having a wide internal data path 302 coupled to a block write circuit 304 according to one embodiment of the present invention. The block write circuit 304 operates in standard and block write modes to transfer data applied on a data bus DQ1–DQ32 over the wide internal data path 302 to addressed memory cells in a plurality of arrays 306–320, as will be explained in more detail below.

In the memory device 300, the wide internal data path 302 includes 128 input/output lines I/O1 I/O128 that transfer data to and from addressed memory cells in the arrays 306–320. Each of the arrays 306–320 includes a plurality of memory cells (not shown) arranged in rows and columns. The arrays 306–320 are arranged as shown, with adjacent arrays coupled to the same 32 input/output lines I/O1–I/O128 of the wide terminal data path 302. For example, the arrays 306 and 308 are coupled to the data lines I/O1–I/032, arrays 310 and 312 are coupled to data lines I/O33–I/O64, and so on. The coupling of the arrays 318,320 to the input/output lines I/O97–I/O128 is illustrated in more detail, and, although now shown for arrays 306–316, one skilled in the art will realize these arrays are coupled to the associated data lines I/O1–I/O128 in the same manner. Each of the arrays 318,320 includes a number of digit lines DL1–DLN coupled to memory cells in respective columns in the array. The digit lines DL1–DLN are coupled to corresponding input/output lines I/O97–I/O128 through respective column select transistors 321. A plurality of column select signals CSEL1–CSELX are applied to the respective gates of the column select transistors 321. In the embodiment of FIG. 2, each of the column select signals CSEL is typically applied to 32 column select transistors 321. One skilled in the art will realize FIG. 2 is a simplified depiction of the interconnection between the arrays 318,320 and corresponding input/output lines I/O97–I/O128, and that additional components such as sense amplifiers and complementary signal lines have been omitted for the sake of brevity. In addition, the physical formation of the arrays 306–320 and wide data path 302 is very different than in a conventional memory device, but is peripheral to the present invention and in the interests of brevity will not be described in further detail. In the memory device 300, the numbers of arrays 306–320 and input/output lines I/O97–I/O128 will vary depending on the specific architecture of the memory device 300.

The operation of the arrays 306–320 is identical, and for the sake of brevity only the operation of the array 318 will be described in more detail. As understood by one skilled in the art, the memory device 300 also includes row and column address decode circuitry (not shown in FIG. 2) that decode respective address signals applied to the memory device and access corresponding memory cells in the arrays 306–320. To transfer data between addressed memory cells in the array 318 and the input/output lines I/O97–I/O128, the row address decode circuitry decodes a row address applied to the memory device 300 and activates a corresponding row in the array 318. At this point, the data stored in the memory cells in the activated row is placed on the respective digit lines DL1–DLN. The column address decode circuitry then decodes a column address applied to the memory device 300, and activates the corresponding one of the column select signals CSEL1–CSELX. The 32 column select transistors 321 receiving the activated column select signal couple the associated digit lines DL1–DLN to the respective input/output lines I/O97–I/O128. For example, when the signal CSEL1 is activated, the digit lines DL1–DL32 are coupled through the activated column select transistors 321 to respective input/output lines I/O97–I/O128. At this point, data is transferred between the input/output lines I/O97–I/O128 and the addressed memory cells. During a read operation, data stored in the addressed memory cells is transferred over the corresponding digit lines, through the column select transistors 321, and onto the input/output lines I/O97–I/O128. During a write operation, write data on the input/output lines I/O97–I/O128 is transferred through the respective transistors 321 and over the corresponding digit lines to the addressed memory cells.

The block write circuit 304 includes a plurality of input buffers BUF1–BUF32 receiving respective data signals applied on data terminals DQ1–DQ32 of the memory device 300. A color register 312 is shown coupled between the data terminals DQ1–DQ32 and the input buffers BUF1–BUF32, and stores color bits CR1–CR32. The color register 322 applies the color bits CR1–CR32 to the input buffers BUF1–BUF32, respectively, when the block write circuit 304 operates in the block write mode, and otherwise applies data on the terminals DQ1–DQ32 to the buffers BUF1–BUF32, respectively, as will be explained in more detail below. The buffers BUF1–BUF32 further receive respective mask signals $\overline{M1}$–$\overline{M32}$ from a mask circuit 324. Each of the buffers BUF1–BUF32 drives a signal on its output to the same logic level as a signal applied on its input when the associated mask signal is inactive, and places its output in a high impedance state when the associated mask signal is active. In this way, when any of the mask signals $\overline{M1}$–$\overline{M32}$ is active, the corresponding ones of the buffers BUF1–BUF32 mask the data signals applied on their respective inputs.

The mask circuit 324 includes a plurality of AND gates AND1–AND32 that develop the mask signals $\overline{M1}$–$\overline{M32}$ on respective outputs. The gates AND1–AND32 receive mask bits MR1–MR32 on respective first inputs. The mask bits MR1–MR32 are stored in a mask register 326 coupled to the data terminals DQ1–DQ32. Each of the gates AND1–AND32 further receives one of four byte mask signals DQM0–DQM3 on a second input, with only the byte mask signals DQM0 and DQM3 being, shown in FIG. 3. Each of the byte mask signal DQM0–DQM3 is applied to the second inputs of a group of eight of the gates AND1–AND32. Thus, the byte mask signals DQM0, DQM1, DQM2, and DQM3 are applied to the second inputs of the gates AND1–AND8, AND9–AND16, AND17–AND24, and AND25–AND32, respectively. Each of the gates AND1–AND32 drives the corresponding mask signal $\overline{M1}$–$\overline{M32}$ active when either the associated byte mask signal DQM0–DQM3 is active high or the associated mask bit MR1–MR32 is set active low. For example, when the mask bit MR1 is set or the byte mask signal DQM0 is active high, the gate AND1 drives the mask signal $\overline{M1}$ active low. When the mask bit MR1 is cleared high, or the byte mask signal DQM0 is inactive low, the gate AND1 drives the mask signal $\overline{M1}$ inactive high.

The block write circuit 304 further includes a plurality of multiplexers MUX1–MUX32 receiving the data signals output by the buffers BUF1–BUF32 on respective inputs. Each of the multiplexers MUX1–MUX32 includes four outputs, and receives a plurality of address signals ADDR and a block write signal BLKWRT. The signals ADDR and BLKWRT are shown applied only to the multiplexer MUX32, but these signals are actually applied to the multiplexers MUX1–MUX31 as well, and have been omitted merely to simplify FIG. 2. The outputs of the multiplexers MUX1–MUX32 are coupled through respective write drivers WD1–WD128 to corresponding ones of the input/output lines I/O1–I/O128. For example, the four outputs of the multiplexer MUX1 are coupled through the write drivers WD1, WD2, WD3, and WD4 to the input/output lines I/O1, 1/O2, 1/O3, and I/O4, respectively. Each of the write drivers WD1–WD128 drives a signal on its output to the level of a signal applied on its input. The write drivers WD1–WD128, buffers BUF1–BUF32, mask register 326 and color register 322 are all conventional circuits, and well understood by those skilled in the art.

In operation, each of the multiplexers MUX1–MUX32 operates in one of two modes, a standard write mode and a block write mode. When the block write signal BLKWRT is inactive, the multiplexers MUX1–MUX32 operate in the standard write mode. In the standard write mode, each of the multiplexers MUX1–MUX32 couples its input to one of its outputs in response to the signals ADDR. In the block write mode, the block write signal BLKWRT is active and each of the multiplexers MUX1–MUX32 couples its input to all four of its outputs independent of the signals ADDR.

The overall operation of the block write circuit 304 will now be described in more detail. For the following description, it will be assumed the desired mask bits MR1–MR32 have been stored in the mask register 326, and the desired bits CR1–CR32 have similarly been stored in the color register 322. During operation, the address decode circuitry decodes address signals applied to the memory device 300 and accesses corresponding memory cells in the arrays 306–320. The block write circuit 304 operates in a standard write mode and a block write mode corresponding to the two modes by the same names previously described for the multiplexers MUX1–MUX32. It will be assumed that during operation in both the standard and block write modes the address decode circuitry accesses memory cells such that single memory cells are coupled to the respective input/output lines I/O1–I/O128, as will be explained in more detail below. For example, in each of the arrays 318,320, only one of the column select signals CSEL1–CSELX is activated at a time such that only a single digit line DL is coupled to each of the input/output lines I/O97–I/O128. Furthermore, column select signals CSEL1–CSELX in both arrays 318,320 are not simultaneously activated so that digit lines DL in both arrays 318,320 are not simultaneously coupled to respective input/output lines I/O97–I/O128.

The block write circuit 304 operates in the standard write mode when the block write signal BLKWRT is inactive. In the standard write mode, the block write circuit 304 operates in one of three submodes, an unmasked submode, a byte-masked submode, and a bit-masked submode. In the unmasked submode, all of the mask bits MR1–MR32 are cleared and all the byte mask signals DQM0–DQM3 are inactive low, causing the mask circuit 324 to drive the mask signals $\overline{M1}$–$\overline{M32}$ inactive high and thereby enabling the buffers BUF1–BUF32 When the buffers BUF1–BUF32 are enabled, data placed on the terminals DQ1–DQ32 is transferred through the buffers BUF1–BUF32, respectively, and applied to the respective inputs of the multiplexers MUX1–MUX32. Each of the multiplexers MUX1–MUX32 transfers data applied on its input to one of the associated write drivers WD1–WD128 which, in turn, places the data on the associated one of the input/output lines I/O1–I/O128 where the data is thereafter transferred through activated column select transistors 321 and across corresponding digit lines DL to the addressed memory cells in the arrays 306–320.

For example, assume that during the unmasked submode the address signals ADDR have values causing each of the multiplexers MUX1–MUX32 to transfer the data applied on its input to the bottom one of the associated write driver circuits WD1–WD128. Thus, the multiplexer MUX1 transfers data applied on its input to the input of the write driver WD4. In this example, data applied on the terminals DQ1–DQ32 is transferred through the buffers BUF1–BUF32 to the multiplexers MUX1–MUX32 which, in turn, transfers the data to every fourth I/O line, 1/O4, I/O8, I/O12, . . . I/O 128 where it is then transferred through activated column select transistors 321 and across corresponding digit lines DL to addressed memory cells in one of the arrays 318 and 320. In this way, during the unmasked submode, 32 bits of data applied on the terminals DQ1–DQ32 are transferred to 32 corresponding addressed memory cells in one of the arrays 306–320.

In the byte-masked submode, the block write circuit 304 operates identically to the unmasked submode except that one of the byte mask signals DQM0–DQM3 is active high masking eight bits of data applied on eight corresponding terminals DQ1–DQ32. For example, when the byte mask signal DQM0 is active, the mask circuit 324 activates the mask signals $\overline{M1}$–$\overline{M8}$ and thereby disables the buffers BUF1–BUF8, respectively. When the buffers BUF1–BUF8 are disabled, data applied on the terminals DQ1–DQ8 is masked and thus not transferred to corresponding addressed memory cells in the arrays 306–320. Thus, each of the byte mask signals DQM0–DQM3 masks a byte of data applied on the terminals DQ1–DQ32.

In the bit-masked submode, the block write circuit 304 once again operates identically to the unmasked submode except that selected bits of data applied on the data terminals DQ1–DQ32 are masked. The mask bits MR1–MR32 stored in the mask register 326 determine which of the data bits applied on the terminals DQ1–DQ32 are masked. For example, assume only the mask bit MR2 is set and all other mask bits are cleared. In this situation, data placed on the terminal DQ2 is masked and thus not stored in the corresponding addressed memory cell coupled to the input/output lien I/O98. In this way, during the bit-masked submode the mask bits MR1–MR32 are used to mask individual bits of data applied on the terminals DQ1–DQ32.

The block write circuit 304 operates in the block write mode when the block write signal BLKWRT is active. As previously described, when the block write signal BLKWRT is active, each of the multiplexers MUX1–MUX32 couples its input to all four of its outputs. During the block write mode, the address decode circuitry in the memory device 300 activates a plurality of column signals CSEL such that a single digit line DL is coupled to each of the input/output lines I/O1–I/O128. For example, the address decode circuitry may activate the column select signals CSEL1 of the arrays 306, 310, 314, and 318, thereby coupling 32 digit lines DL in each of these arrays to the 32 corresponding input/output lines I/O1–I/O128. During the block write mode, the block write circuit 304 again operates in an unmasked submode, a byte-masked submode, and a bit-masked submode, and the color bits CR1–CR32 stored in the color register 322 are applied to the inputs of the buffers BUF1–BUF32, respectively. In the unmasked submode, each of the color bits CR1–CR32 is transferred through the associated one of the buffers BUF1–BUF32 and multiplexers MUX1–MUX32 to four addressed memory cells in the arrays 306–320. For example, the color bit CR1 is transferred through the buffer BUF1 and through the multiplexer MUX1 to the respective inputs of the write drivers WD1–WD4, which, in turn, place this data on the input/output lines I/O1, I/O2, I/O3, and I/O4, respectively. The color bit CR1 data on the lines I/O1, I/O2, I/O3, and I/O4 is thereafter transferred through activated column select transistors 321 and over corresponding digit lines DL to the addressed memory cells in the arrays 306–320. Thus, in the unmasked submode, the 32 color bits CR1–CR32 are transferred to 128 addressed memory cells in activated ones of the arrays 306–320. In this way, the block write circuit 304 enables each of the color bits CR1–CR32 to be written to a plurality of memory cells in the arrays 306–320.

During the byte-masked submode, the mask circuit 324 operates as previously described during the standard write mode of operation to mask a byte of data applied to eight corresponding buffers BUF1–BUF32. For example, when the byte mask signal DQM0 is active high, the buffers BUF1–BUF8 are disabled masking the color bits CR1–CR8, respectively. In this situation, each of the multiplexers MUX1–MUX8 has its input data masked which, in turn, masks the four bits of data output by each of these multiplexers during the block write mode. Thus, when the byte mask signal DQM0 is active, 32 bits of data that would normally be output by the multiplexers MUX1–MUX8 are masked.

Finally, in the bit-masked submode, the mask bits MR1–MR32 mask selected ones of the color bits CR1–CR32. For example, assume the mask bit MR2 is set and all other mask bits are cleared. In this situation, all the color bits CR1 and CR3–CR32 are transferred to a plurality of addressed memory cells as previously described for the unmasked submode. In response to the set color bit CR2, the mask circuit 324 activates the mask signal $\overline{M2}$ disabling the buffer BUF2. When the buffer BUF2 is disabled, the color bit CR2 is masked from the multiplexer MUX2, which, in turn, masks the four bits of data normally transferred through the write drivers WD5–WD8 to the data line I/O5, I/O6, I/O7, and I/O8, respectively. Thus, the set mask bit MR2 masks the color bit CR2 from four addressed memory cells in the arrays 306–320. Each set mask bit MR1–MR32 similarly masks the associated color bit CR1–CR32 from four addressed memory cells in the arrays 306–320. Thus, during the bit-masked submode, the mask bits MR1–MR32 may be utilized to mask selected ones of the color bits CR1–CR32 from four corresponding memory cells in the arrays 306–320

Figure 1:
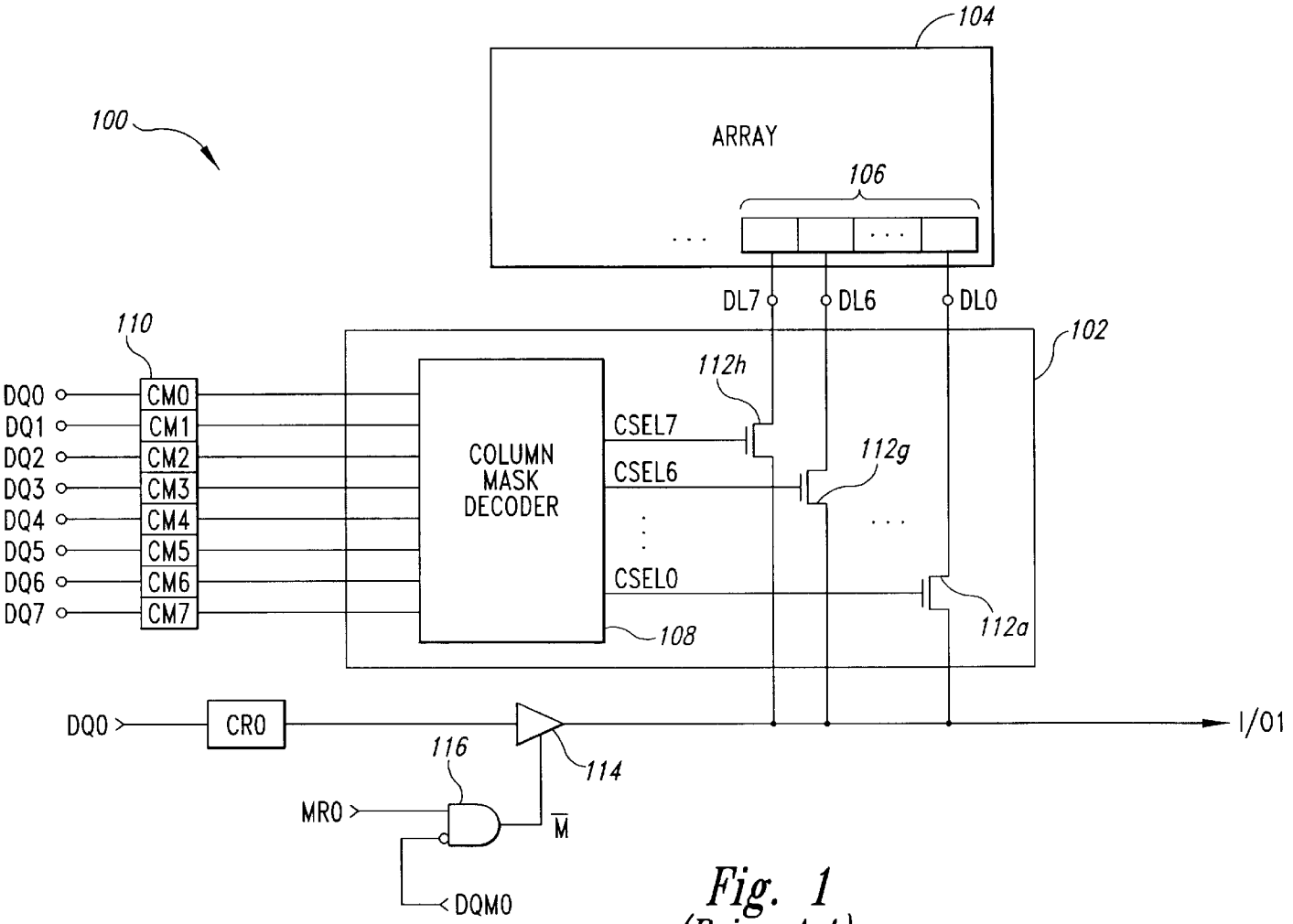
Fig. 1 (Prior Art)
FIG. 1 is a functional block diagram of one of a portion of an SGRAM including a conventional block write circuit.

The block write circuit 304 performs block write data transfers in the memory device 300 having the wide internal data path 302. During the block write mode, each color bit CR1–CR32 is transferred to four addressed memory cells in the arrays 306–320 subject to the masking signals $\overline{M1}$–$\overline{M32}$ from the mask circuit 324. The block write circuit 304 also performs bit masking of selected color bits CR1–CR32 along with byte masking of bytes of the color bits CR1–CR32 in the block write mode. With the block write circuit 304, the time it takes to perform a block write data transfer is reduced. This is true because a single digit line DL and corresponding addressed memory cell is coupled to each of the input/output lines I/O1–I/O128. Thus, each of the write drivers WD1–WD128 drives the load presented by a single digit line DL coupled to the associated input/output line I/O1–I/O128, just as it would during a conventional write data transfer. In contrast, as previously described with reference to FIG. 1, in prior art block write circuits a plurality of digit lines are coupled to each of the input/output lines I/O1–I/O128, and a single write driver must drive the larger load presented by these multiple digit lines, increasing thetime it takes to perform a block write data transfer.

It should be noted that during block write transfers, the address decode circuitry could activate multiple column select signals CSEL–CSELN for each of the arrays 306–320 and thereby couple multiple digit lines to each of the input/output lines I/O1–I/O128. Coupling multiple digit lines to each of the input/output lines I/O1–I/O128 would increase the number of memory cells to which data is transferred during the block write mode. For example, in the array 318 the column select signals CSEL1 and CSELX may be simultaneously activated, coupling the digit lines DL1–DL32 and DLN-32–DLN to the respective input/output lines I/O97–I/O128. Alteratively, the column select signals CSEL1 for the arrays 318,320 may be simultaneously activated, coupling the digit lines DL1–DL32 in each of the arrays 318,320 to the respective input/output lines I/O97–I/O128. In this embodiment, however, one skilled in the art will realize the time for performing block write transfers may increase, and column masking, which will be discussed below, will also not be possible among multiple memory cells coupled through digit lines to a common input/output line.

In an alternative embodiment of the block write circuit 304, column mask signals CMASK are applied to each of the multiplexers MUX1–MUX32, enabling the block write circuit 304 to perform the equivalent of column masking during block write operations, as will now be explained in more detail. Once again, the signal CMASK is shown applied only to the multiplexer MUX32 merely to simplify FIG. 2. In response to the column mask signals CMASK, each of the multiplexers MUX1–MUX32 operates during the block write mode to isolate selected ones of its outputs from its input, thereby enabling the equivalent of column masking to be performed during the block write mode. For example, assume the block write circuit 304 operates in the block write mode and the mask signal $\overline{M32}$ is inactive high enabling the buffer BUF32, which applies the color bit CR32 to the input of the multiplexer MUX32. In this embodiment, during the block write mode the multiplexer MUX32 selectively masks the color bit CR32 from the respective input/output lines I/O125, I/O126, I/O127, and I/O128 in response to the mask signals CMASK. In this way, the multiplexer MUX32 performs the equivalent of column masking since the color bit CR32 may be masked from individual addressed memory cells during the block write mode.

Figure 3:
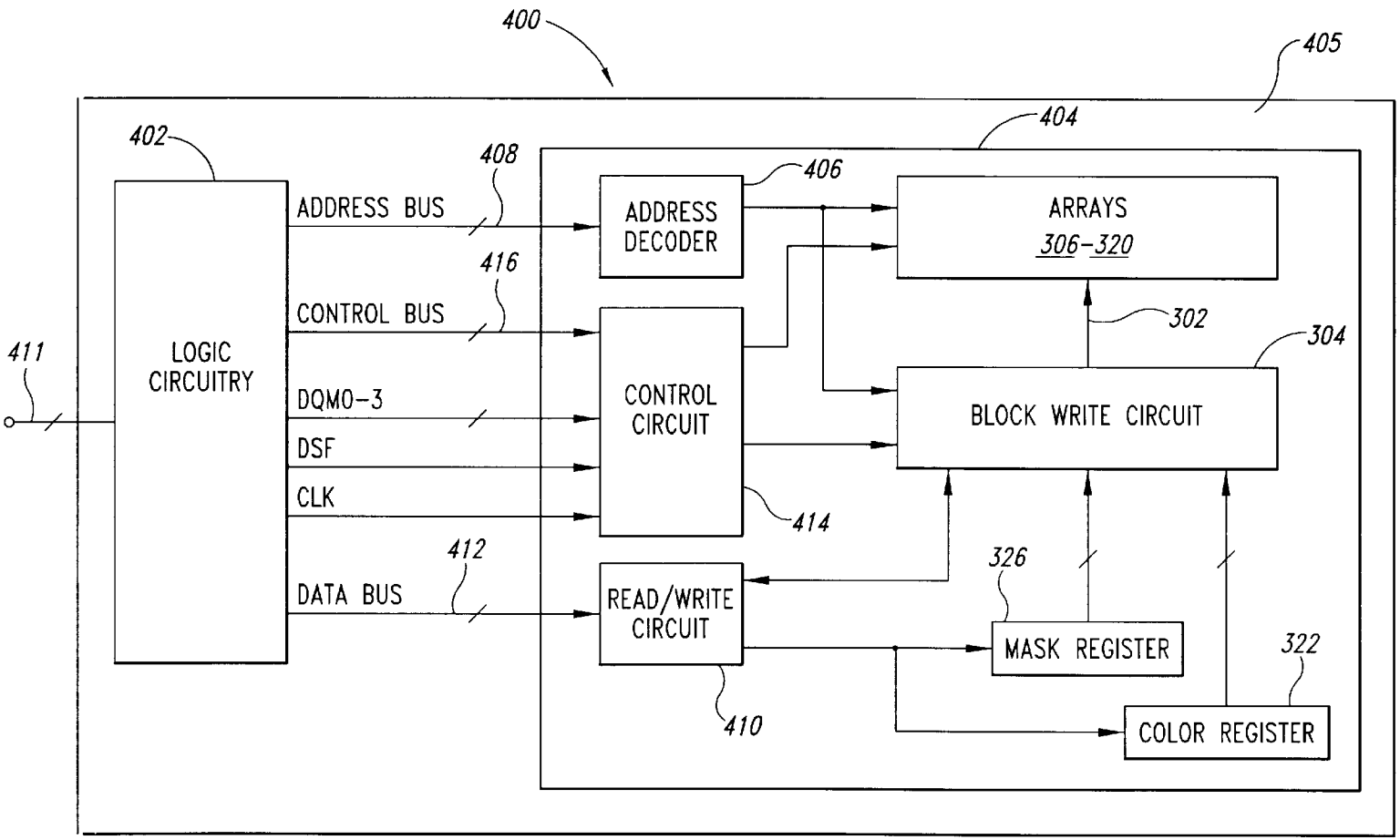
FIG. 3 is a functional block diagram of an Embedded DRAM having a memory device including the block write circuit of FIG. 2.

The block write circuit 304 of FIG. 2 may be utilized in any memory device having a wide internal data path, such as an Embedded DRAM or a packetized DRAM like an SLDRAM. FIG. 3 illustrates one application of the block write circuit 304 in an Embedded DRAM 400. The Embedded DRAM 400 is an integrated circuit in which logic circuitry 402 and an SGRAM 404 including the block write circuit 304 are formed in a semiconductor substrate 405. In other words, the logic circuitry 402 is "embedded" in the same semiconductor substrate 405 in which the SGRAM 404 is formed. The fabrication of the Embedded DRAM 400 has become possible due to advances in the design and fabrication of integrated circuits that have significantly reduced the sizes of transistors and other components forming such integrated circuits. Such size reductions have accordingly increased the density of transistors and other components that may be formed in a semiconductor substrate of a given size.

In the Embedded DRAM 400, the logic circuitry 402 may be designed to perform a specific function, or may be more general purpose circuitry, such as a microprocessor performing a variety of different tasks. The logic circuitry 402 is coupled to external terminals 411 to communicate with external circuitry (not shown in FIG. 3) coupled to the Embedded DRAM 400, and also develops address, data, and control signals to transfer data to and from the SGRAM 404. The SGRAM 404 includes two memory banks, BANK0 and BANK1, each bank including the arrays 306–320 and coupled to the block write circuit 304 through the wide data path 302. The SGRAM 404 further includes the mask register 326 and color register 322 that store and apply the mask bits MR1–MR32 and color bits CR1–CR32, respectively, to the block write circuit 304. An address decoder 406 receives address signals on an address bus 408 and outputs decoded address signals to the arrays 306–320 and block write circuit 304, and a read/write circuit 410 transfers data between a data bus 412 and the block write circuit 304. In addition, the read/write circuit 410 also transfers mask and color data placed on the data bus 412 to the mask register 326 and color register 322, respectively.

A control circuit 414 receives control signals applied on a control bus 416 and controls the arrays 306–320, block write circuit 304, read/write circuit 410, and other components in the SGRAM 404 in response to these control signals. The control circuit 414 also receives the byte mask signals DQM0–3, a special function signal DSF, and an external clock signal CLK that drives the control circuit 414 during data transfer operations. In the SGRAM 404, all operations are referenced to a particular edge of the external clock signal CLK, typically the rising edge, as known in the art.

The control circuit 414 receives a number of command signals on the control bus 416 that define the operation to be executed by the SGRAM 404. These command signals typically include a chip selecting signal $\overline{CS}$, write enable signal $\overline{WE}$, column address strobe signal $\overline{CAS}$, and row address strobe signal $\overline{RAS}$. Specific combinations of these signals define particular data transfer commands of the SGRAM 404 such as ACTIVE, PRECHARGE, READ, and WRITE as known in the art. In addition, certain ones of these commands in combination with the special function signal DSF and byte mask signals DQM0–3 places the SGRAM 404 in the block write mode and mask data applied on the data bus 412, as will be explained in more detail below. Typically, during standard ACTIVE and WRITE commands, the special function signal DSF is maintained inactive low. When an active special function signal DSF is applied coincident with an ACTIVE command, the SGRAM 404 applies the mask stored in the mask register 326 to data applied on the data bus 412 during a subsequent WRITE command. Similarly, when the special function signal DSF is active coincident with an applied WRITE command, the SGRAM 404 operates in the block write mode to transfer color bits stored in the color register 322 to addressed memory cells in the arrays 306–320. In response to the byte mask signals DQM0–3, the control circuit 414 controls the read/write circuit 410 to mask bytes of data as previously described.

In operation, the logic circuitry 402 applies address, data, and control signals on the respective busses 408, 412, and 416, and drives the external clock signal CLK to transfer data to and from the SGRAM 404. During a read data transfer operation, the logic circuitry 402 applies an ACTIVE command to the SGRAM 404 including a row address and bank address placed on the address bus 408. In response to the row and bank addresses, the address decoder 406 decodes these addresses and activates the corresponding bank of the arrays 306–320 and the corresponding row of memory cells within that bank. The logic circuitry 402 thereafter applies a READ command to the SGRAM 404 including a column and bank addresses applied on the address bus 408. The bank address portion of the READ command enables multiple banks in the SGRAM 404 to be opened, and data read from selected ones of those open banks. In response to the column address, the address decoder 406 accesses corresponding memory cells within the activated row in the corresponding banks. The data stored in the accessed memory cells is thereafter transferred over the wide data path 302 to the read/write circuit 410, which, in turn, places the data on the data bus 412 where it is read by the logic circuitry 402 The logic circuitry 402 may also activate selected ones of the byte mask signals DQM0–3 during a read cycle to mask corresponding bytes of data to typically placed on the data bus 412 during the read cycle. As understood by one skilled in the art, during a read cycle the byte mask signals DQM0–3 are typically utilized by the logic circuitry 402 to prevent data contention on the data bus 412 when a read cycle is immediately followed by a write cycle.

During a write cycle, the logic circuitry 402 once again applies an ACTIVE command to the SGRAM 404 to activate a corresponding bank of the arrays 306–320 and a row within that bank. After applying the ACTIVE command, the logic circuitry 402 applies a WRITE command to the SGRAM 404 including column and bank addresses on the address 408 and write data on the data bus 412. Once again, the address decoder 406 decodes the column address and accesses corresponding memory cells in the activated row of the corresponding bank. The data placed on the data bus 412 is then transferred through the read/write circuit 410, block write circuit 304, and across the wide internal data path 302 to addressed memory cells in the arrays 306–320. During a conventional write cycle, the logic circuitry 402 controls the byte mask signals DQM0–3 to selectively mask bytes of data applied on the data bus 412, as previously described. In addition, the logic circuitry 402 may also mask individual bits of data applied on the data bus 412 using the mask bits MR1–MR32 stored in the mask register 326.

As understood by one skilled in the art, the logic circuitry 402 applies special load commands to the SGRAM 404 to load the mask bits MR1–MR32 in the same mask register 326, and must load the desired mask bits before masking write data applied on the data bus 412. In order to mask data placed on the data bus 412 using the mask bits MR1–MR32 stored in the mask register 326, the logic circuitry 402 must drive the special function signal DSF active coincident with applying the ACTIVE command, which is typically referred to as an ACTIVE with WPB command. The block write circuit 304 masks all write data placed on the data bus 412 according to the mask bits MR1–MR32 after such an ACTIVE with WPB command is applied, and until a subsequent conventional ACTIVE command is applied. The logic circuitry 402 controls the byte mask signals SQM0–3 and applies ACTIVE with WPB commands to mask write data placed on the data bus 412 as desired.

To place the SGRAM 404 in the block write mode, the logic circuitry 402 first applies an ACTIVE command to activate a bank and a addressed row within that bank. After applying the ACTIVE command, the logic circuitry 402 applies a block write command by driving the special function signal DSF active coincident with applying a WRITE command to the SGRAM 404. Column mask data may also be applied on the data bus 412 coincident with the block write command, causing the block write circuit 304 to perform column masking as previously described. In response to the active special function signal DSF registered coincident with the WRITE command, the control circuit 414 places the block write circuit 304 in the block write mode of operation. The WRITE command portion of the block write command again includes column and bank addresses on the address bus 408. The address decoder 406 decodes the column and bank addresses and activates corresponding blocks of memory cells in the corresponding bank. The block write circuit 304 operates as previously described to transfer the color bits CR1–CR32 stored in the color register 322 to the addressed blocks of memory cells in the arrays 306–320. Once again, the logic circuitry 402 must apply special load commands to the SGRAM 404 to load the desired color bits CR1–CR32 before placing the SGRAM 404 in the block write mode of operation. During the block write mode of operation, the logic circuitry 402 may again utilize the byte mask signals DQM0–3 and mask bits MR1–MR32 stored in the mask register 326 to selectively mask the color bits CR1–CR32 stored in the color register 322, as previously described.

Figure 4:
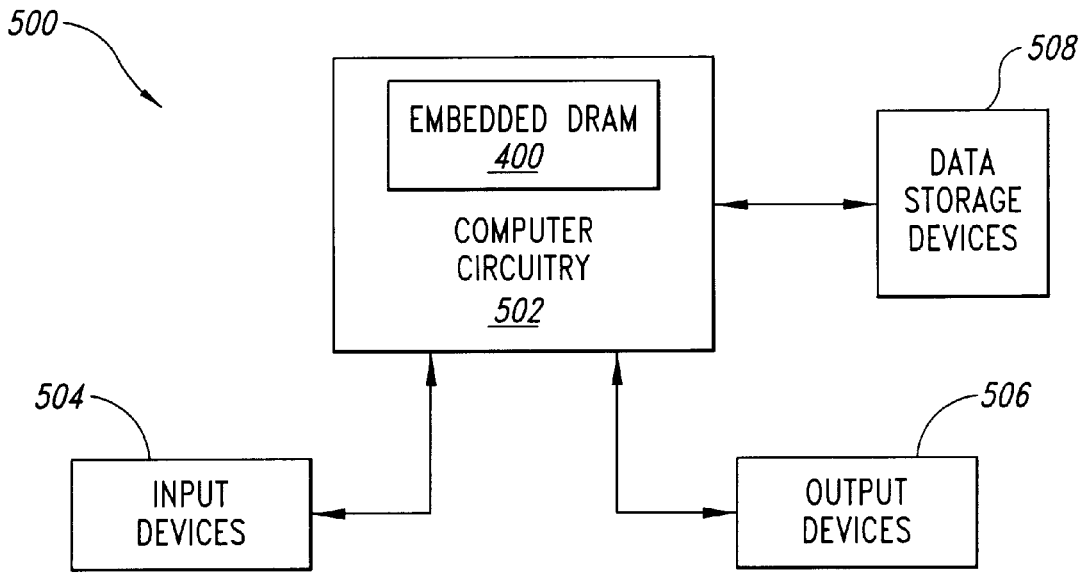
FIG. 4 is a functional block diagram of a computer system including the embedded DRAM of FIG. 3.

FIG. 4 is a block diagram of a computer system 500 including the embedded DRAM 400 of FIG. 3. The computer system 500 includes computer circuitry 502 for performing various computing functions, such as executing specific software to perform specific calculations or tasks. In the computer system 500, the embedded DRAM 400 typically has its logic circuitry 402 designed to perform a specific function, such as high-resolution graphics or high-speed communication operations. The computer system 500 further includes one or more input devices 504, such as a keyboard or a mouse, coupled to the computer circuitry 502 to allow an operator to interface with the computer system 500. Typically, the computer system 500 includes one or more output devices 506 coupled to the computer circuitry 502, such output devices typically being a printer or a video terminal. One or more data storage devices 508 are also typically coupled to the computer circuitry 502 to store data or retrieve data from the external storage media (not shown in FIG. 5). Examples of typical data storage devices 508 include hard and floppy disks, tape cassettes, and compact disk read-only memories ("CD-ROMs").

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

We claim:

1. A block write circuit in a memory device including at least one array of memory cells, each of the at least one array of memory cells including a plurality of memory cells arranged in rows and columns and a plurality of digit lines, each digit line coupled to a plurality of memory cells in an associated column, the block write circuit comprising:

a plurality of input/output lines;

a switch circuit coupled between the input/output lines and the digit lines, the switch circuit selectively coupling at least one digit line to each input/output line responsive to an address signal during a block write mode of operation;

a plurality of driver circuits, each driver circuit including an input an output coupled to a respective input/output line, and developing a data signal on its output in response to a data signal applied on its input; and a multiplexer circuit having an input adapted to receive a data signal, and a plurality of outputs coupled to respective inputs of the driver circuits, the multiplexer circuit coupling its input to its outputs responsive to a control signal during the block write mode of operation.

2. The block write circuit of claim 1 wherein the switch circuit couples a single digit line to each input/output line during the block write mode of operation.

3. The block write circuit of claim 1 wherein the input of [the multiplexer] *each buffer* circuit receives a *respective* color bit data signal from a color register during the block write mode of operation.

4. The block write circuit of claim 1 wherein the switch circuit includes a plurality of column select transistors, each column select transistor having signal terminals coupled between a respective digit line and a corresponding input/output line having its control terminal adapted to receive a column select signal.

5. The block write circuit of claim 1 wherein the multiplexer circuit includes one input and four outputs.

6. A block write circuit in a memory device including at least one array of memory cells, each of the at least one array of memory cells including a plurality of memory cells arranged in rows and columns and a plurality of digit lines, each digit line coupled to a plurality of memory cells in an associated column, the block write circuit comprising:

a plurality of input/output lines;

a switch circuit coupled between the input/output lines and the digit lines, the switch circuit selectively coupling at least one digit line to each input/output line responsive to an address signal during a block write mode of operation;

a plurality of driver circuits, each driver circuit including an input, and an output coupled to a respective input/output lines, and developing a data signal on its output in response to a data signal applied on its input; and a multiplexer circuit having an input adapted to receive a data signal, and a plurality of outputs coupled to respective inputs of the driver circuits, the multiplexer circuit coupling its input to selected ones of its outputs and isolating its input from the other ones of its outputs responsive to first signals during the block write mode of operation.

7. The block write circuit of claim [6] *1* wherein the [first signals include] *control signal includes* a block write signal and a plurality of column mask signals.

8. The block write circuit of claim 6 wherein the switch circuit couples a single digit line to each input/output line during the block write mode of operation.

9. The block write circuit of claim 6 wherein the input of the multiplexer circuit receives a color bit data signal from a color register during the block write mode of operation.

10. The block write circuit of claim 6 wherein the switch circuit includes a plurality of column select transistors, each column select transistor having signal terminals coupled between a respective digit line and a corresponding input/output line, and having a control terminal adapted to receive a column select signal.

11. The block write circuit of claim 6 wherein the multiplexer circuit includes one input and four outputs.

12. A block write circuit in a memory device, comprising:

a plurality of data terminals adapted to receive respective data signals;

a plurality of arrays groups, each array group including a plurality of arrays and each array including a plurality of memory cells arranged in rows and columns and a plurality of digit lines, each digit line coupled to a plurality of memory cells in an associated column;

a plurality of input/output line groups, each input/output line group including a plurality of input/output lines;

a plurality of switch circuits, each switch circuit coupled between the input/output lines of a respective input/output line group and the digit lines of the arrays in an associated array group, and each switch circuit selectively coupling at least one digit line to each input/output line responsive to address signals during a block write mode of operation;

a plurality of write driver groups, each write driver group including a plurality of write driver circuits having outputs coupled to respective input/output lines in an associated input/output line group, each write driver circuit including an input, and developing a data signal on its output responsive to a data signal applied on its input; and a multiplexer circuit including a plurality of inputs coupled to respective data terminals, and a plurality of output subgroups, each output subgroup associated with a respective input, and each output group including a plurality of outputs coupled to respective inputs of the write driver circuits in an associated write driver group, the multiplexer circuit operable responsive to the control signal in a block write mode to couple each of its inputs to the outputs in the associated output subgroup.

13. The block write circuit of claim 12 wherein each switch circuit couples a single digit line to each input/output line during the block write mode of operation.

14. The block write circuit of claim 12 wherein during the block write mode of operation each [of the inputs of the multiplexer] *buffer* circuit receives a respective color bit data signal from a corresponding storage location in a color register.

15. The block write circuit of claim 12 wherein each switch circuit includes a plurality of column select transistors, each column select transistor having signal terminals coupled between a respective digit line and a corresponding input/output line, and having a control terminal adapted to receive a column select signal.

16. The block write circuit of claim 12 wherein the multiplexer circuit further operates in the block write mode responsive to column masking signals to isolate each input from selected ones of the outputs in the associated output subgroup.

17. The block write circuit of claim 12 wherein the plurality of array and input/output line groups include four array and four input/output line groups, respectively, each input/output line group including thirty-two input/output lines, the plurality of data terminals including thirty-two data terminals, each write driver group including thirty-two write drivers, and each output subgroup of the multiplexer circuit including four outputs.

18. The block write circuit of claim 12 wherein the multiplexer circuit includes one multiplexer for each output subgroup.

19. The block write circuit of claim 18 wherein each multiplexer includes one input and four outputs.

20. A block write circuit in a memory device including a plurality of data terminals and an array including a plurality of memory cells arranged in rows and columns and having a plurality of digit lines, each digit line coupled to a plurality of memory cells in an associated column, the block write circuit comprising:

a plurality of input/output lines;

a switch circuit coupled between the input/output lines and the digit lines, the switch circuit selectively coupling at least one digit line to each input/output line responsive to an address signal during a block write mode of operation;

a plurality of write driver circuits, each write driver circuit having an input, an output coupled to a respective input/output line, and developing a data signal on its output in response to a data signal applied on its input;

a plurality of buffer circuits, each buffer circuit including an output, an input coupled to a respective data terminal, and an enable terminal adapted to receive an enable signal, each buffer circuit developing a signal on its output in response to a signal applied on its input when the enable signal is active, and placing its output in a high impedance state when the enable signal is inactive;

a masking circuit adapted to receive a plurality of masking signals, and applying a plurality of enable signals to respective enable terminals of the buffer circuits in response to the masking signals; and a multiplexer circuit having a plurality of inputs coupled to respective outputs of the buffer circuits, and a plurality of outputs coupled to respective inputs of the write driver circuits, the multiplexer circuit operable responsive to a control signal in the block write mode to couple each of its inputs to a plurality of associated outputs.

21. The block write circuit of claim 20 wherein the multiplexer circuit further operates during the block write mode to isolate each input from selected ones of the associated outputs responsive to column mask signals.

22. The block write circuit of claim 20 wherein the multiplexer circuit operates during the block write mode to couple each of its inputs to four associated outputs.

23. The block write circuit of claim 20 wherein the masking circuit is adapted to receive a plurality of byte-mask signals and bit-mask signals, and operates to enable or disable eight corresponding enable signals in response to each byte-mask signal, and enables or disables respective enable signals in response to corresponding bit-mask signals.

24. The block write circuit of claim 20 wherein the masking circuit comprises a plurality of AND gates, each AND gate including a first input adapted to receive a respective bit-mask signal and a second input adapted to receive a respective byte-mask signal, and developing a corresponding enable signal on its output.

25. The block write circuit of claim 20 wherein the input of each buffer circuit is adapted to receive a respective one of a plurality of color bit signals stored in a color register.

26. The block write circuit of claim 20 wherein the switch circuit couples one digit line to each input/output line during the block write mode of operation.

27. A memory device, comprising:

an address bus adapted to receive address signals;

a control bus adapted to receive control signals;

a data bus adapted to receive at least one data signal;

at least one array of memory cells including a plurality of memory cells arranged in rows and columns and a plurality of digit lines, each digit line coupled to the memory cells in associated column;

an address decoder coupled to the address bus and the at least one array;

a control circuit coupled to the control bus;

a read/write circuit coupled to the data bus; and a block write circuit coupled to the address decoder and control circuit, the block write circuit comprising:

a plurality of input/output lines;

a switch circuit coupled between the input/output lines and the digit lines of the at least one array, the switch circuit selectively coupling at least one digit line to each input/output line responsive to an address signal during a block write mode of operation;

a plurality of driver circuits, each driver circuit including an input, and an output coupled to a respective input/output line, and developing a data signal on its output in response to a data signal applied on its input; and a multiplexer circuit having an input adapted to receive a data signal, and a plurality of outputs coupled to respective inputs of the driver circuits, the multiplexer circuit coupling its input to its outputs responsive to a control signal during the block write mode of operation.

28. The memory device of claim 27 wherein the memory device includes a DRAM.

29. The memory device of claim 27 wherein the multiplexer circuit further operates in a column mask mode to isolate selected ones of its output from its input.

30. The memory device of claim 27 wherein [the multiplexer] *each buffer* circuit receives on its input a color bit data signal stored in a color register.

31. The memory device of claim 27 wherein the switch circuit couples a single digit line to each input/output line.

32. A memory device, comprising:

an address bus adapted to receive address signals;

a control bus adapted to receive control signals;

a data bus adapted to receive at least one data signal;

at least one array of memory cells including a plurality of memory cells arranged in rows and columns and a plurality of digit lines, each digit line coupled to the memory cells in associated column;

an address decoder coupled to the address bus and the at least one array;

a control circuit coupled to the control bus;

a read/write circuit coupled to the data bus; and a block write circuit coupled to the address decoder and control circuit, the block write circuit comprising:

a plurality of input/output lines;

a switch circuit coupled between the input/output lines and the digit lines of the at least one array, the switch circuit selectively coupling at least one digit line to each input/output line responsive to an address signal during a block write mode of operation;

a plurality of driver circuits, each driver circuit including an input, and an output coupled to a respective input/output line, and developing a data signal on its output in response to a data signal applied on its input;

a plurality of buffer circuits, each buffer circuit including an output, an input coupled to a respective data terminal of the data bus, and an enable terminal adapted to receive an enable signal, each buffer circuit developing a signal on its output in response to a signal applied on its input when the enable signal is active, and placing its output in a high impedance state when the enable signal is inactive;

a masking circuit coupled to the data bus and adapted to receive a plurality of masking signals and applying a plurality of enable signals to respective enable terminals of the buffer circuits in response to the masking signals;

a multiplexer circuit having a plurality of inputs coupled to respective outputs of the buffer circuits, and a plurality of outputs coupled to respective inputs of the write driver circuits, the multiplexer circuit operable responsive to a control signal to couple each of its inputs to a plurality of associated outputs in the block write mode; and a color register coupled to the data bus and to the inputs of the multiplexer circuit, the color register operable to store color data bits applied on the data bus and apply color data bits to the inputs of the multiplexer circuit during the block write mode.

33. The memory device of claim 32 wherein the memory device includes a DRAM.

34. The memory device of claim 32 wherein the multiplexer circuit further operates in a column mask mode to isolate each of its inputs from selected ones of the associated outputs responsive to column mask signals.

35. The memory device of claim 32 wherein the switch circuit couples a single digit line to each input/output line during the block write mode.

36. An embedded memory device, comprising:

a logic circuit developing address, and control signals on respective internal address, data and control busses, and operable to perform a desired function; and a memory device coupled to the logic circuit through the internal address, control, and data busses, the memory device comprising:

an address bus adapted to receive address signals;

a control bus adapted to receive control signals;

a data bus adapted to receive at least one data signal;

at least one array of memory cells including a plurality of memory cells arranged in rows and columns and a plurality of digit lines, each digit line coupled to the memory cells in an associated column;

an address decoder coupled to the address bus and the at least one array;

a control circuit coupled to the control bus;

a read/write circuit coupled to the data bus; and a block write circuit coupled to the address decoder and control circuit, the block write circuit comprising:

a plurality of input/output lines;

a switch circuit coupled between the input/output lines and the digit lines of the at least one array, the switch circuit selectively coupling at least one digit line to each input/output line responsive to an address signal during a block write mode of operation;

a plurality of driver circuits, each driver circuit including an input, and an output coupled to a respective input/output line, and developing a data signal on its output in response to a data signal applied on its input; and a multiplexer circuit having an input adapted to receive a data signal, and a plurality of outputs coupled to respective inputs of the driver circuits, the multiplexer circuit coupling its input to its outputs responsive to a control signal during the block write mode of operation.

37. The embedded memory device of claim 36 wherein the memory device includes a DRAM.

38. The embedded memory device of claim 36 wherein the multiplexer circuit [further] operates in a column mask mode to isolate selected ones of its outputs from its input.

39. The embedded memory device of claim 36 wherein [the multiplexer] *each buffer* circuit receives on its input a color bit data signal stored in a color register.

40. The embedded memory device of claim 36 wherein the switch circuit couples a single digit line to each input/output line.

41. A computer system, comprising:

a data input device;

a data output device; and computing circuitry coupled to the data input and output devices, the computing circuitry including an embedded memory device, comprising:

a logic circuit operable to perform a desired function, and operable to develop address, data, and control signals on respective internal address, data and control busses; and a memory device coupled to the logic circuit through the internal address, control, and data busses, the memory device comprising:

an address bus adapted to receive address signals;

a control bus adapted to receive control signals;

a data bus adapted to receive at least one data signal;

at least one array of memory cells including a plurality of memory cells arranged in rows and columns and a plurality of digit lines, each digit line coupled to the memory cells in an associated column;

an address decoder coupled to the address bus and the at least one array;

a control circuit coupled to the control bus;

a read/write circuit coupled to the data bus; and a block write circuit coupled to the address decoder and control circuit, the block write circuit comprising:

a plurality of input/output lines;

a switch circuit coupled between the input/output lines and the digit lines of the at least one array, the switch circuit selectively coupling at least one digit line to each input/output line responsive to an address signal during a block write mode of operation;

a plurality of driver circuits, each driver circuit including an input, and an output coupled to a respective input/output line, and developing a data signal on its output in response to a data signal applied on its input; and a multiplexer circuit having an input adapted to receive a data signal, and a plurality of outputs coupled to respective inputs of the driver circuits, the multiplexer circuit coupling its input to its outputs responsive to a control signal during the block write mode of operation.

42. The computer system of claim 41 wherein the memory device includes a DRAM.

43. A method for writing a block of data to a plurality of memory cells in a memory device including a data terminal and having an array of memry cells, the array including a plurality of memory cells arranged in rows and columns and a plurality of digit lines, each digit line coupled to the digit lines in an associated column, and a plurality of input/output lines being coupled through a switch circuit to the digit lines, comprising:

activating a row of memory cells in the array;

coupling the digit lines associated with an addressed block of memory cells to respective input/output lines, each digit line being coupled to a different input/output line; and transferring a data signal applied on the data terminal over the respective input/output lines and over the corresponding digit lines to each of the memory cells in the addressed block.

44. The memory of claim 43 wherein the addressed block of memory cells includes thirty-two memory cells, and each of the thirty-two digit lines associated with the memory cells in the addressed block is coupled to a respective one of thirty-two input/output lines.

45. The method of claim 43 wherein a color bit data signal is transferred to the memory cells in the addressed block.

46. A method for writing a block of data to a plurality of memory cells in a memory device including a data terminal and having an array of memory cells, the array including a plurality of memory cells arranged in rows and columns and a plurality of digit lines, each digit line coupled to the digit lines in an associated column, and a plurality of input/output lines being coupled through a switch circuit to the digit lines, comprising:

activating a row of memory cells in the array;

coupling the digit lines associated with an addressed block of memory cells to respective input/output lines, each digit line being coupled to a different input/output line; and transferring a data signal applied on the data terminal over the respective input/output lines and over the corresponding digit lines to each of the memory cells in the addressed block; and isolating the data signal from selected input/output lines to thereby mask the data signal from corresponding memory cells in the addressed block.

47. The method of claim 46 wherein the addressed block of memory cells includes thirty-two memory cells, and each of the thirty-two digit lines associated with the memory cells in the addressed block is coupled to a respective one of thirty-two input/output lines.

48. The method of claim 46 wherein the data signal is a color bit data signal.

49. The method of claim 46 wherein the data signal is masked from bytes of memory cells within the addressed block responsive to byte-mask signals.

50. A method for writing a block of data to a plurality of memory cells in a memory device including a data terminal and having an array of memory cells, the array including a plurality of memory cells arranged in rows and columns and a plurality of digit lines, each digit line coupled to the digit lines in an associated column, and a plurality of input/output lines being coupled through a switch circuit to the digit lines, comprising:

activating a plurality of memory cells in the array;

placing the memory device in a block write mode;

coupling at least some of the activated memory cells through the associated digit lines to respective input/output lines; and transferring a data signal applied on the data terminal over respective input/output lines to memory cells coupled to the input/output lines.

51. The method of claim 50 wherein the data signal includes a color bit data signal applied to the data terminal.

*52. A block write circuit in a memory device including at least one array of memory cells, each of the at least one array of memory cells including a plurality of memory cells arranged in rows and columns and a plurality of digit lines, each digit line coupled to a plurality of memory cells in an associated column, the block write circuit comprising:*

*a plurality of input/output lines;*

*a switch circuit coupled between the input/output lines and the digit lines, the switch circuit selectively coupling at least one digit line to each input/output line responsive to an address signal during a block write mode of operation;*

*a plurality of driver circuits, each driver circuit including an input, an output coupled to a respective input/output line, and developing a data signal on its output in response to a data signal applied on its input;*

*a plurality of buffer circuits, each buffer circuit including an output, an input coupled to a respective data terminal, and an enable terminal adapted to receive an enable signal, each buffer circuit developing a signal on its output in response to a signal applied on its input when the enable signal is active, and placing its output in a high impedance state when the enable signal is inactive;*

*a masking circuit adapted to receive a plurality of masking signals, and applying a plurality of enable signals to respective enable terminals of the buffer circuits in response to the masking signals; and*

*a multiplexer circuit having an input adapted to receive a data signal, a control terminal adapted to receive a*

*control signal, and a plurality of outputs coupled to respective inputs of the driver circuits, the multiplexer circuit coupling the input to selected outputs responsive to the control signal during the block write mode of operation.*

*53. The block write circuit of claim 52 wherein the switch circuit couples a single digit line to each input/output line during the block write mode of operation.*

*54. The block write circuit of claim 52 wherein the input of each buffer circuit receives a respective color bit data signal from a color register during the block write mode of operation.*

*55. The block write circuit of claim 52 wherein the switch circuit includes a plurality of column select transistors, each column select transistor having signal terminals coupled between a respective digit line and a corresponding input/output line having its control terminal adapted to receive a column select signal.*

*56. The block write circuit of claim 52 wherein the multiplexer circuit includes one input and four outputs.*

*57. A block write circuit in a memory device, comprising:*

*a plurality of data terminals adapted to receive respective data signals;*

*a plurality of array groups, each array group including a plurality of arrays and each array including a plurality of memory cells arranged in rows and columns and a plurality of digit lines, each digit line coupled to a plurality of memory cells in an associated column;*

*a plurality of input/output line groups, each input/output line group including a plurality of input/output lines;*

*a plurality of switch circuits, each switch circuit coupled between the input/output lines of a respective input/output line group and the digit lines of the arrays in an associated array group, and each switch circuit selectively coupling at least one digit line to each input/output line responsive to address signals during a block write mode of operation;*

*a plurality of write driver groups, each write driver group including a plurality of write driver circuits having outputs coupled to respective input/output lines in an associated input/output line group, each write driver circuit including an input, and developing a data signal on its output responsive to a data signal applied on its input;*

*a plurality of buffer circuits, each buffer circuit including an output, an input coupled to a respective data terminal, and an enable terminal adapted to receive an enable signal, each buffer circuit developing a signal on its output in response to a signal applied on its input when the enable signal is active, and placing its output in a high impedance state when the enable signal is inactive;*

*a masking circuit adapted to receive a plurality of masking signals, and applying a plurality of enable signals to respective enable terminals of the buffer circuits in response to the masking signals; and*

*a multiplexer circuit including a plurality of inputs coupled to respective outputs of the buffer circuits and including a plurality of output subgroups, each output subgroup, associated with a respective input, and each output group including a plurality of outputs coupled to respective inputs of the write driver circuits in an associated write driver group, the multiplexer circuit operable responsive to the control signal in a block write mode to couple each of its input to the outputs in the associated output subgroup.*

*58. The block write circuit of claim 57 wherein each switch circuit couples a single digit line to each input/output line during the block write mode of operation.*

*59. The block write circuit of claim 57 wherein during the block write mode of operation each buffer circuit receives a respective color bit data signal from a corresponding storage location in a color register.*

*60. The block write circuit of claim 57 wherein each switch circuit includes a plurality of column select transistors, each column select transistor having signal terminals coupled between a respective digit line and a corresponding input/output line, and having a control terminal adapted to receive a column select signal.*

*61. The block write circuit of claim 57 wherein the multiplexer circuit further operates in the block write mode responsive to column mask signals to isolate each input from selected ones of the outputs in the associated output subgroup.*

*62. The block write circuit of claim 57 wherein the plurality of array and input/output line groups include four array and four input/output line groups, respectively, each input/output line group including thirty-two input/output lines, the plurality of data terminals including thirty-two data terminals, each write driver group including thirty-two write drivers, and each output subgroup of the multiplexer circuit including four outputs.*

*63. The block write circuit of claim 57 wherein the multiplexer circuit includes one multiplexer for each output subgroup.*

*64. The block write circuit of claim 63 wherein each multiplexer includes one input and four outputs.*

*65. A memory device, comprising:*

*an address bus adapted to receive address signals;*

*a control bus adapted to receive control signals;*

*a data bus adapted to receive at least one data signal;*

*at least one array of memory cells including a plurality of memory cells arranged in rows and columns and a plurality of digit lines, each digit line coupled to the memory cells in an associated column;*

*an address decoder coupled to the address bus and the at least one array;*

*a control circuit coupled to the control bus;*

*a read/write circuit coupled to the data bus; and*

*a block write circuit coupled to the address decoder and control circuit, the block write comprising:*

*a plurality of input/output lines;*

*a switch circuit coupled between the input/output lines and the digit lines of the at least one array, the switch circuit selectively coupling at least one digit line to each input/output line responsive to an address signal during a block write mode of operation;*

*a plurality of driver circuits, each driver circuit including an input, and an output coupled to a respective input/output line, and developing a data signal on its output in response to a data signal applied on its input;*

*a plurality of buffer circuits, each buffer circuit including an output, an input coupled to a respective data terminal, and an enable terminal adapted to receive an enable signal, each buffer circuit developing a signal on its output in response to a signal applied on its input when the enable signal is active, and placing its output in a high impedance state when the enable signal is inactive;*

*a masking circuit adapted to receive a plurality of masking signals, and applying a plurality of enable*

*signals to respective enable terminals of the buffer circuits in response to the masking signals; and*

*a multiplexer circuit having an input adapted to receive a data signal, a control terminal adapted to receive a control signal, and a plurality of outputs connected to respective inputs of the driver circuits, the multiplexer circuit coupling the input to selected outputs respective to the control signal during the block write mode of operation.*

*66. The memory device of claim 65 wherein the memory device includes a DRAM.*

*67. The memory device of claim 65 wherein the multiplexer circuit further operates in a column mask mode to isolate selected ones of its outputs from its input.*

*68. The memory device of claim 65 wherein each buffer circuit receives on its input a color bit data signal stored in a color register.*

*69. The memory device of claim 65 wherein the switch circuit couples a single digit line to each input/output line.*

*70. A method for writing a block of data to a plurality of memory cells in a memory device including a data terminal and having an array of memory cells, the array including a plurality of memory cells arranged in rows and columns and a plurality of digit lines, each digit line being coupled to the memory cells in an associated column, and the memory device including a plurality of input/output lines, the method comprising:*

*activating a row of memory cells in the array;*

*coupling the digit lines associated with an addressed block of memory cells to respective input/output lines, each digit line being coupled to a different input/output line;*

*storing a masking bit in the memory device;*

*transferring a data signal applied on the data terminal over the respective input/output lines and over the corresponding digit lines to each of the memory cells in the addressed block when the stored masking bit has a first value; and*

*masking the data signal from the memory cells in the addressed block when the stored masking bit has a second value.*

*71. The method of claim 70 wherein the addressed block of memory cells includes thirty-two memory cells, and each of the thirty-two digit lines associated with the memory cells in the addressed block is coupled to a respective one of thirty-two input/output lines.*

*72. The method of claim 70 wherein a color bit data signal is transferred to the memory cells in the addressed block.*

*73. A block write circuit in a memory device including at least one array of memory cells, each of the at least one array of memory cells including a plurality of memory cells arranged in rows and columns and a plurality of digit lines, each digit line coupled to a plurality of memory cells in an associated column, the block write circuit comprising:*

*a plurality of input/output lines;*

*a switching means coupled between the input/output lines and the digit lines for selectively coupling at least one digit line to each input/output line responsive to an address signal during a block write mode of operation;*

*a plurality of driver means each being coupled to respective input/output lines for developing a data signal on an output in response to a data signal applied on an input;*

*a plurality of buffering means each being coupled to a respective data terminal for developing a signal on an output in response to a signal applied on an input when an applied enable signal is active, and for placing the output in a high impedance state when the enable signal is inactive;*

*a masking means for applying a plurality of enable signals to respective enable terminals of the buffer circuits in response to a plurality of masking signals; and*

*a multiplexing means having a plurality of outputs coupled to respective inputs of the driver means for coupling an input to a selected output responsive to a control signal during the block write mode of operation.*

*74. The block write circuit of claim 73 wherein the switching means couples a single digit line to each input/output line during the block write mode of operation.*

*75. The block write circuit of claim 73 wherein the input of each buffering means receives a respective color bit data signal from a color register during the block write mode of operation.*

*76. The block write circuit of claim 73 wherein the switching means includes a plurality of column selection means for coupling respective digit lines to the input/output lines responsive to respective column select signals.*

* * * * *